United States Patent
Paavola et al.

(10) Patent No.: US 12,082,332 B2
(45) Date of Patent: Sep. 3, 2024

(54) THERMAL MANAGEMENT SYSTEMS HAVING SIGNAL TRANSFER ROUTING FOR USE WITH ELECTRONIC DEVICES

(71) Applicant: Intel Corporation, Santa Clara, CA (US)

(72) Inventors: Juha Paavola, Hillboro, OR (US); Sami Heinisuo, Portland, OR (US); Kari Mansukoski, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 741 days.

(21) Appl. No.: 17/131,166

(22) Filed: Dec. 22, 2020

(65) Prior Publication Data

US 2021/0112654 A1 Apr. 15, 2021

(51) Int. Cl.
*H05K 7/20* (2006.01)
*G06F 1/20* (2006.01)
*H05K 1/02* (2006.01)

(52) U.S. Cl.
CPC ....... *H05K 1/0201* (2013.01); *H05K 7/20163* (2013.01); *H05K 7/2039* (2013.01); *G06F 1/203* (2013.01)

(58) Field of Classification Search
CPC ............. H05K 1/0201; H05K 7/20163; H05K 7/2039; G06F 1/203
See application file for complete search history.

(56) References Cited

U.S. PATENT DOCUMENTS

| | | | | |
|---|---|---|---|---|
| 3,401,369 A | * | 9/1968 | Roche | H01R 12/721 219/541 |
| 3,904,934 A | * | 9/1975 | Martin | H01R 12/714 361/776 |
| 4,628,407 A | * | 12/1986 | August | H05K 1/0206 257/E23.101 |
| 4,731,701 A | * | 3/1988 | Kuo | H01L 23/49827 257/E23.101 |
| 4,860,165 A | * | 8/1989 | Cassinelli | H01L 23/36 257/E23.101 |
| 4,884,168 A | * | 11/1989 | August | H05K 7/20254 174/15.1 |
| 5,030,113 A | * | 7/1991 | Wilson | H01R 12/79 439/931 |
| 5,307,519 A | * | 4/1994 | Mehta | H05K 1/0204 455/343.1 |
| 5,323,293 A | * | 6/1994 | Angiulli | H05K 7/20372 361/699 |

(Continued)

*Primary Examiner* — Adrian S Wilson
(74) *Attorney, Agent, or Firm* — Hanley, Flight & Zimmerman, LLC (57) ABSTRACT thermal management systems having signal transfer routing for use with electronic devices are disclosed. An electronic device includes a housing to house a first electronic component and a second electronic component. A circuit board is positioned inside the housing. The circuit board including a first signal path to communicatively couple a processor carried by the circuit board and the first electronic component. A thermally conductive structure is positioned adjacent the circuit board. The thermally conductive structure is to dissipate heat generated by the processor. The thermally conductive structure is to carry at least a portion of a second signal path to communicatively couple the processor and the second electronic component.

20 Claims, 8 Drawing Sheets

(56) References Cited

U.S. PATENT DOCUMENTS

| | | | | |
|---|---|---|---|---|
| 5,638,895 | A * | 6/1997 | Dodson | H01L 23/467 |
| | | | | 257/E23.099 |
| 5,768,104 | A * | 6/1998 | Salmonson | H05K 7/20454 |
| | | | | 257/714 |
| 5,808,870 | A * | 9/1998 | Chiu | H01L 23/3675 |
| | | | | 361/708 |
| 6,212,071 | B1 * | 4/2001 | Roessler | H05K 7/20509 |
| | | | | 361/720 |
| 6,226,178 | B1 * | 5/2001 | Broder | G06F 1/203 |
| | | | | 361/679.52 |
| 6,934,152 | B1 * | 8/2005 | Barrow | H05K 7/1461 |
| | | | | 361/744 |
| 7,095,615 | B2 * | 8/2006 | Nichols | H05K 7/1461 |
| | | | | 361/713 |
| 8,735,728 | B2 * | 5/2014 | Cheng | H05K 7/205 |
| | | | | 361/708 |
| 9,674,986 | B2 * | 6/2017 | Pope | H01L 23/373 |
| 9,685,598 | B2 * | 6/2017 | Marc | H10N 10/17 |
| 10,327,325 | B2 * | 6/2019 | Edlinger | H05K 3/188 |
| 10,462,935 | B2 * | 10/2019 | Farshchian | H05K 7/20818 |
| 2003/0202306 | A1 * | 10/2003 | Dubhashi | H01L 23/4275 |
| | | | | 257/E23.089 |
| 2018/0168070 | A1 * | 6/2018 | Ware | G06F 1/18 |
| 2023/0022182 | A1 * | 1/2023 | Paavola | G06F 1/1616 |

\* cited by examiner

THERMAL MANAGEMENT SYSTEMS HAVING SIGNAL TRANSFER ROUTING FOR USE WITH ELECTRONIC DEVICES

FIELD OF THE DISCLOSURE

This disclosure relates generally to electronic devices, and, more particularly, to thermal management systems having signal transfer routing for use with electronic devices.

BACKGROUND

Electronic devices employ thermal systems to manage thermal conditions to maintain optimal efficiency. To manage thermal conditions, electronic devices employ thermal cooling systems that cool electronic components of the electronic devices during use.

The figures are not to scale. In general, the same reference numbers will be used throughout the drawing(s) and accompanying written description to refer to the same or like parts. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Descriptors "first," "second," "third," etc. are used herein when identifying multiple elements or components which may be referred to separately. Unless otherwise specified or understood based on their context of use, such descriptors are not intended to impute any meaning of priority, physical order, or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

During operation of an electronic device (e.g., a laptop, a tablet, etc.), hardware components disposed in a body or housing of the device, such as a processor, graphics card, and/or battery, generate heat. Heat generated by the hardware components of the electronic device can cause a temperature of one or more electronic components to exceed operating temperature limits of the electronic components.

To prevent overheating of the hardware components, the electronic device includes a thermal management system to dissipate heat from the electronic device. Example thermal management systems can include active cooling systems or passive cooling systems. Passive cooling systems are often employed with processors that do not exceed approximately 10 watts of power. Processors that exceed 10 watts of power often require active cooling systems to effectively cool these processors below desired operating temperatures.

Active cooling systems employ forced convention methods to increase a rate of fluid flow, which increases a rate of heat removal. For example, to exhaust heat or hot air generated within the body of the electronic device and cool the electronic device, active cooling systems often employ external devices such as fans or blowers, forced liquid, thermoelectric coolers, etc.

Passive cooling systems employ natural convection and heat dissipation by utilizing heat sinks and/or heat spreaders to increase (e.g., maximize) radiation and convection heat transfer. For instance, passive cooling systems do not employ external devices such as fans or blowers that would otherwise force airflow to exhaust heat from the housing of the electronic device. Instead, passive cooling systems rely on material characteristic(s) to provide heat transfer pathways between electronic components and outer surfaces or skins of the electronic devices. Passive cooling systems are significantly less expensive than active cooling systems, do not require power to operate, and provide space saving benefits.

Although passive cooling systems provide space saving benefits, electronic devices often employ relatively thin circuit boards and/or small x-y board architecture to provide a smaller form factor. Reducing the size of a printed circuit board increases manufacturing complexity for routing signal transfer paths (e.g., traces) on the printed circuit board. Dense communication areas of a printed circuit board provide a relatively narrow signal path (e.g., between adjacent traces or signal paths), which results in a dense signal processing area of the circuit board. As electronic systems become more complicated and electrical interfaces in the electrical systems operate at higher frequencies, dense signal processing areas (such as those adjacent a fan module) can cause crosstalk or unwanted signal cross-over between adjacent signal paths. For example, crosstalk may be noise induced by one signal that interferes with another signal, which reduces the performance of the electronic device. As a result, thinner boards and smaller x-y circuit board architecture that result in narrow and/or tight signal path routes can cause signal integrity loss, thereby reducing the performance of the electronic device. Further, multiple layers formed on the circuit board to alleviate dense signal paths may not be an option because a circuit board with multiple layers increases a board thickness (e.g., in the z-direction) that can exceed a desired thickness and/or may affect a desired overall thickness (e.g., in the z-direction) of an electronic device.

Circuit boards often have limited routing space near a central processing unit (e.g., a CPU). Signals paths on the circuit board consume space and, thus, often such space requirements set limits for board size miniaturization and/or battery size maximization, particularly in mobile devices. If several layers are provided on the circuit board, the printed circuit board thickness or height increases. Thus, known signal routing space configurations often limit other performance metrics (e.g., battery life, size performance, etc.) and/or overall dimensional characteristics of electronic devices.

Some example apparatus disclosed herein provide passive cooling in combination with signal processing. An example passive cooling system disclosed herein provides a physical heat transfer path (e.g., between one or more electronic components of an electronic device and an outer skin of the electronic device) and an electrical signal path (e.g., between the electronic components of an electronic device and a processor). Specifically, one or more structures of a passive cooling system include signal routing paths (e.g., traces) to increase space for signal processing paths of the circuit board. Providing signal routing paths on one or more structures of the passive cooling system reduces signal density and/or congestion on the circuit board, providing additional space on the circuit board for critical routing of signal paths to a central processing unit. For example, high speed data and/or other I/O component signaling paths can be routed via one or more structures of a thermal management system instead of the circuit board. Such routing can be provided adjacent a central processing unit or processor, which provides more space on the circuit board.

Figure 1:
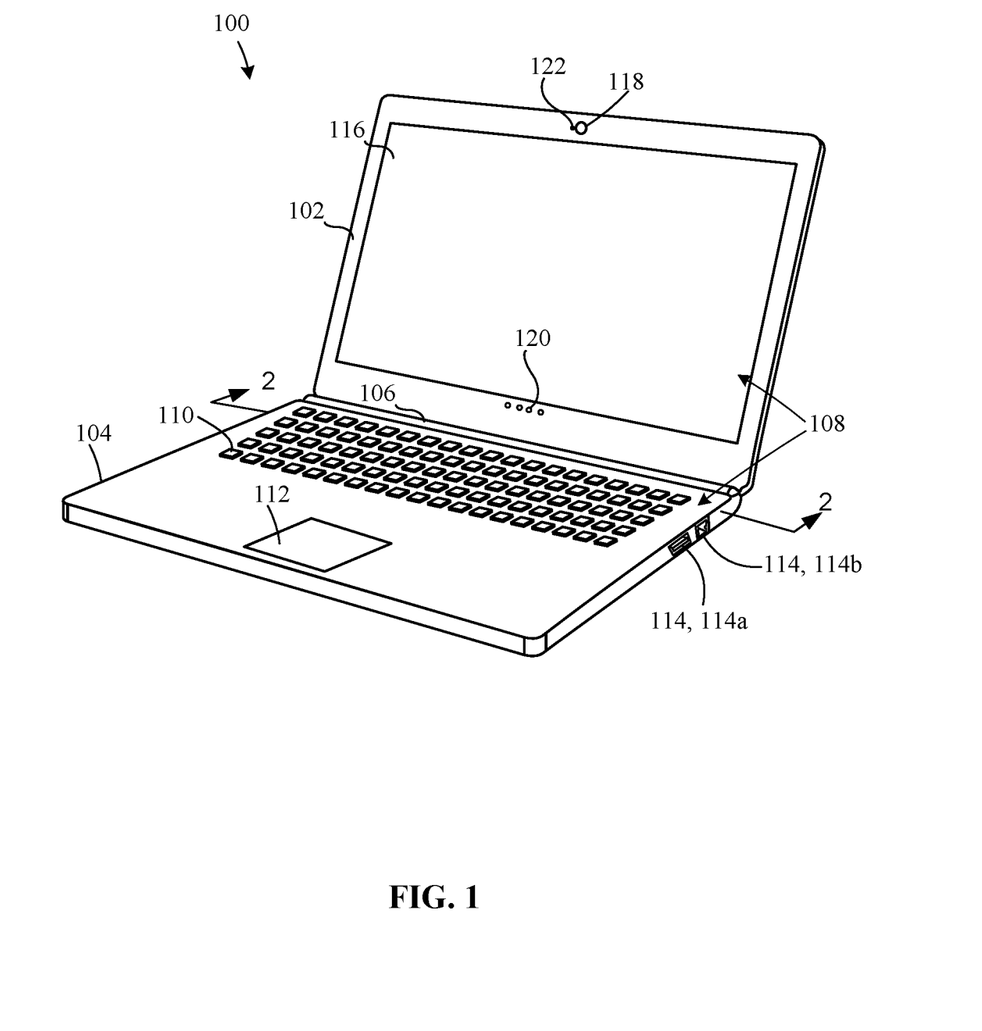
FIG. 1 is an example electronic device having an example thermal management system constructed in accordance with teachings of this disclosure.

FIG. 1 is an example electronic device 100 constructed in accordance with teachings of this disclosure. The electronic device of the illustrated example is a personal computing device such as, for example, a laptop. The electronic device 100 of the illustrated example includes a first housing 102 coupled to a second housing 104 via a hinge 106. The hinge 106 enables the second housing 104 to rotate or fold relative to first housing 102 between a stored position (e.g., where the second housing 104 is aligned or parallel with the first housing 102) and an open position as shown in FIG. 1 (e.g., where the second housing 104 is non-parallel relative to the first housing 102). In the open position, the second housing 104 can rotate relative to the first housing 102 about the hinge 106 to a desired viewing angle.

The first housing 102 and/or the second housing 104 houses and/or carries electronic components 108 of the electronic device 100. For example, the electronic components 108 of the illustrated example include a keyboard 110 and a track pad 112, I/O connectors 114 (e.g., universal serial bus (USB) 114a, ethernet connector 114b, etc.), a display 116, a camera 118, a speaker 120 and a microphone 122. Other electronic components 108 can include, but are not limited to, a graphics card, a battery, light emitting diodes, memory, a storage drive, an antenna, etc. For example, the first housing 102 houses the display 116, the camera 118, the speakers 120, and the microphone 122. The second housing 104 of the illustrated example houses the keyboard 110 and the track pad 112, which are exposed via the second housing 104 to enable user inputs, the I/O connectors 114.

Although the example electronic device 100 of the illustrated example is a laptop, in some examples, the electronic device 100 can be a tablet (e.g., having a single housing), a desktop computer, a mobile device, a cell phone, a smart phone, a hybrid or convertible PC, a personal computing (PC) device, a sever, a modular compute device, a digital picture frame, a graphic calculator, a smart watch, and/or any other electronic device that employs passive cooling.

Figure 2:
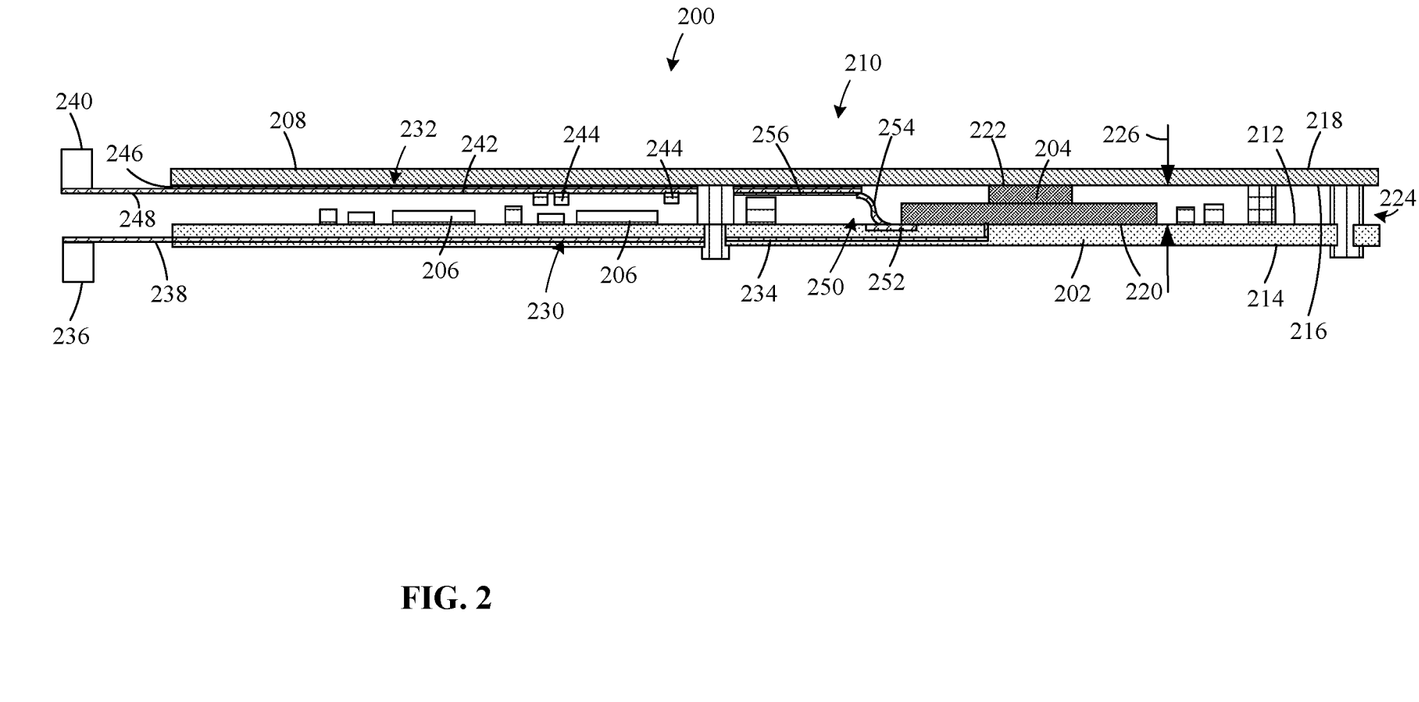
FIG. 2 is a cross-sectional view of the example electronic device of FIG. 1 taken along line 2-2 of FIG. 1 illustrating an example thermal management system disclosed herein.

FIG. 2 is a cross-section of the example electronic device 100 of FIG. 2 taken along line 2-2 of FIG. 1. Referring to FIG. 2, the electronic device 100 of the illustrated example includes an example hardware component assembly 200 disclosed herein. The second housing 104 (FIG. 1) of the illustrated example carries the hardware component assembly 200. In some examples, an auxiliary or secondary hardware component and thermal management system assembly can be located and/or carried by the first housing 102.

The hardware component assembly 200 of the illustrated example include a circuit board 202 (e.g., a printed circuit board (PCB)) to which a processor 204 (e.g., a system on chip (SOS)) is coupled. The circuit board 202 supports one or more circuit components 206 (e.g., resistors, transistors, capacitors, diodes, inductors, integrated circuits, etc.).The processor 204 of the illustrated example does not exceed 10 watts of power. However, in some examples, the processor 204 can exceed 10 watts of power. The processor 204 of the illustrated example is positioned between the circuit board 202 and a thermally conductive structure 208 of a thermal management system 210. Specifically, the processor 204 is positioned between a first surface 212 (e.g., a first horizontal or flat surface) of the circuit board opposite a second surface 214 (e.g., a second horizontal or flat surface) and a first surface 216 (e.g., a first horizontal or flat surface) of the thermally conductive structure 208 opposite a second surface 218 (e.g., a second horizontal or flat surface) of the thermally conductive structure 208. The first surface 212 of the circuit board 202 of the illustrated example is oriented toward (e.g., faces) the first surface 216 of the thermally conductive structure 208. In other words, the processor 204 of the illustrated example is sandwiched between the first surface 212 of the circuit board and the first surface 216 of the thermally conductive structure 208. For example, a first side 220 of the processor 204 directly engages the first surface 212 of the circuit board 202 and a second side 222 of the processor 204 opposite the first side 220 directly engages the first surface 216 of the thermally conductive structure 208. Thus, a gap or space 224 between (e.g., the first surface 212 of) the circuit board 202 and (e.g., the first surface 216 of) the thermally conductive structure is often determined by a height 226 (e.g., in a z-direction) of the processor 204.

To reduce a number of signal routings formed on the circuit board 202, the example hardware component assembly 200 of the illustrated example separates at least portions of signal routings between the circuit board 202 and the thermally conductive structure 208. To separate the signal routings, the example hardware component assembly 200 includes a first signal path 230 supported or carried by the circuit board 202 and at least a portion of a second signal path 232 supported or carried by the thermally conductive structure 208. In some examples, the second signal path 232 can be one or more departing signal routings from the processor 204. In some examples, the second signal path 232 can be one or more returning signal routings to the processor 204. In some examples, the first signal path 230 provides a signal path for departing signal routings from the processor 204 and the second signal path 232 provides returning signal routings to the processor 204. The illustrated example of FIG. 2 illustrates a single first signal path and a single second signal path. However, the first signal path 230 can include a plurality of first signal paths formed on the circuit board 202 and the second signal path 232 can include a plurality of second signal paths formed on the thermally conductive structure 208.

To communicatively and/or electrically couple (e.g., communicatively couple) the processor 204 and the electronic components 108 (e.g., FIG. 1) and/or the circuit components 206 of the electronic device 100, the circuit board 202 of the illustrated example includes the first signal path 230. The first signal path 230 of the illustrated example is a trace 234 composed of a conductive material (e.g., copper, aluminum, gold, etc.). Specifically, the trace 234 is carried by the circuit board 202. The trace 234 can be formed on and/or between layers of the circuit board 202 via traditional circuit board (e.g., printed circuit board) manufacturing techniques and/or processes.

The first signal path 230 of the illustrated example can include critical signal paths including, but not limited to, for example, gating signals, ethernet signals, etc. For example, the first signal path 230 of the illustrated example electrically and/or communicatively couples the processor 204 and a first electronic component 236 of the electronic device 100. For example, the first electronic component 236 of the illustrated example is the ethernet connector 114b (FIG. 1). In some examples, the first signal path 230 can electrically and/or communicatively couple the processor 204 and one or more of the other electronic components 108 including, for example, the display 116, the speaker 120, the microphone 122, etc. The first electronic component 236 of the illustrated example is coupled to the trace 234 of the circuit board 202 via a flex connector 238 (e.g., a flex trace and/or other connectors).

To increase signal path and/or routing space on the circuit board 202 (e.g. for critical signal paths), the thermally conductive structure 208 of the illustrated example includes the second signal path 232. The second signal path 232 can provide routing for high speed data signals and/or routing between the processor 204 and one or more of the electronic components 108. For example, the thermally conductive structure 208 of the illustrated example includes the second signal path 232 to communicatively and/or electrically couple the processor 204 and a second electronic component 240 of the electronic device 100. The second signal path 232 is carried by the thermally conductive structure 208 to reduce signal bottlenecks and/or signal congestion on the circuit board 202. In other words, the second signal path 232 would otherwise be carried by the circuit board 202, thereby increasing signal routings on the circuit board 202. In the illustrated example, the second electronic component 240 is the camera 118 of FIG. 1. In other examples, the second electronic component 240 can be one or more of the electronic components 108 of the electronic device 100 (e.g., not communicatively coupled to the processor 204 via the first signal path 230). For example, the second electronic component 240 can be the microphone 122, the speaker 120, the display 116, and/or other electronic components of the electronic device 100. In some examples, the second signal path 232 can be configured to support at least portions of a critical and/or high speed signal path (e.g., an ethernet signal, a gate signal, etc.).

The second signal path 232 of the illustrated example is a second trace 242 carried by the thermally conductive structure 208. Additionally, the second signal path 232 supports circuit components 244 (e.g., transistors, integrated circuits, capacitors, resistors, inductors, diodes, etc.) that are communicatively and/or electrically coupled via the second trace 242. In the illustrated example, the second trace 242 (e.g., and the circuit components 244) is attached to the first surface 216 of the thermally conductive structure 208. For example, the second trace 242 and/or the circuit components 244 of the illustrated example can be formed on a flexible circuit board that can be attached to the first surface 216 of the thermally conductive structure 208 via, for example, adhesive 246. In some examples, the adhesive 246 can be a thermally conductive adhesive. The second signal path 232 electrically and/or communicatively couples to the second electronic component 240 via a flex connector 248. In some examples, the second trace 242, when formed on a flexible circuit board, can be formed to extend directly to the second electronic component 240. In some examples, the second signal path 232 (e.g., the second trace 242 and/or the circuit components 244) can be formed on the first surface of the thermally conductive structure 208 via laser direct sintering technology, additive manufacturing technology, and/or any other suitable flexible circuit board, printed circuit board, trace formation and/or other signal path manufacturing techniques.

In some examples, an insulation layer (e.g., an electrical insulator, insulation paste, etc.) can be provided between the first surface 216 of the thermally conductive structure 208 and the second signal path 232 (e.g., the second trace 242, a flexible circuit defining the second trace 242, etc.). In this manner, if the thermally conductive structure is made of an electrically conductive material (e.g., copper), the thermally conductive structure 208 does not interfere with (e.g., degrade a signal of) the second signal path 232. In some examples, at least one of a film or an adhesive can be positioned over the second signal path 232 (e.g., the second trace 242) to shield against electromagnetic induction.

To communicatively couple the second signal path 232 and/or the second trace 242 and the processor 204, the circuit board 202 of the illustrated example includes connection signal path 250. The connection signal path 250 can be a connection trace 252 formed on the circuit board 202. To electrically couple the second signal path 232 and the processor 204 via the connection signal path 250, the electronic device 100 employs a trace connector 254. For example, a first end of the trace connector 254 is coupled to the second signal path 232 (e.g., the second trace 242) and a second end of the trace connector 254 opposite the first end is coupled to the connection signal path 250. For example, the trace connector 254 of the illustrated example is a spring connector (e.g., a flex-to-circuit board connector). In some examples, the second signal path 232 can be electrically coupled to the connection signal path 250 via a wire, an electrically conductive structure and/or any other bridge or connector for connecting the second trace 242 and the connection trace 252. For example, in some examples, the second trace 242 can be connected to the processor 204 by soldering a wire to the second trace 242 and the connection trace 252. As described below, in some examples, the second signal path 232 can be directly attached or coupled to the processor 204 without requiring a connection to the circuit board 202. Thus, in some examples, the trace connector 254, the connection trace 252 and/or the connection signal path 250 can be omitted.

The thermally conductive structure 208 of the illustrated example can be a vapor chamber, a heat spreader, a heat sink, a cold plate heat sink, a heat pipe, structural chassis, a thermal distributor (e.g., in low power devices) and/or any other thermally conductive structure of the thermal management system 210.

Additionally, to shield the second signal path 232 against electromagnetic induction and/or other interference, the second signal path 232 includes at least one of a film or adhesive 256. For example, the film or adhesive 256 can be positioned over at least a portion of the second signal path 232 and/or the second trace 242.

In operation, the thermally conductive structure 208 provides a passive cooling system or heat sink for the electronic device 100. For example, heat generated by the circuit components 206 and/or the processor 204 of the illustrated example is dissipated (e.g., spread) across the first surface 216 of the thermally conductive structure 208. For example, heat generated by the processor 204 is spread and/or absorbed across the thermally conductive structure 208 (e.g., a vapor chamber) and transferred to the second surface 218 of the thermally conductive structure 208. The thermally conductive structure 208 is structured to dissipate and/or transfer away the heat from the second surface 218 to a frame of the second housing 104. For example, the second surface 218 of the thermally conductive structure 208 can be configured to transfer heat to a skin or frame (e.g., a chassis) of the second housing 104.

Figure 3:
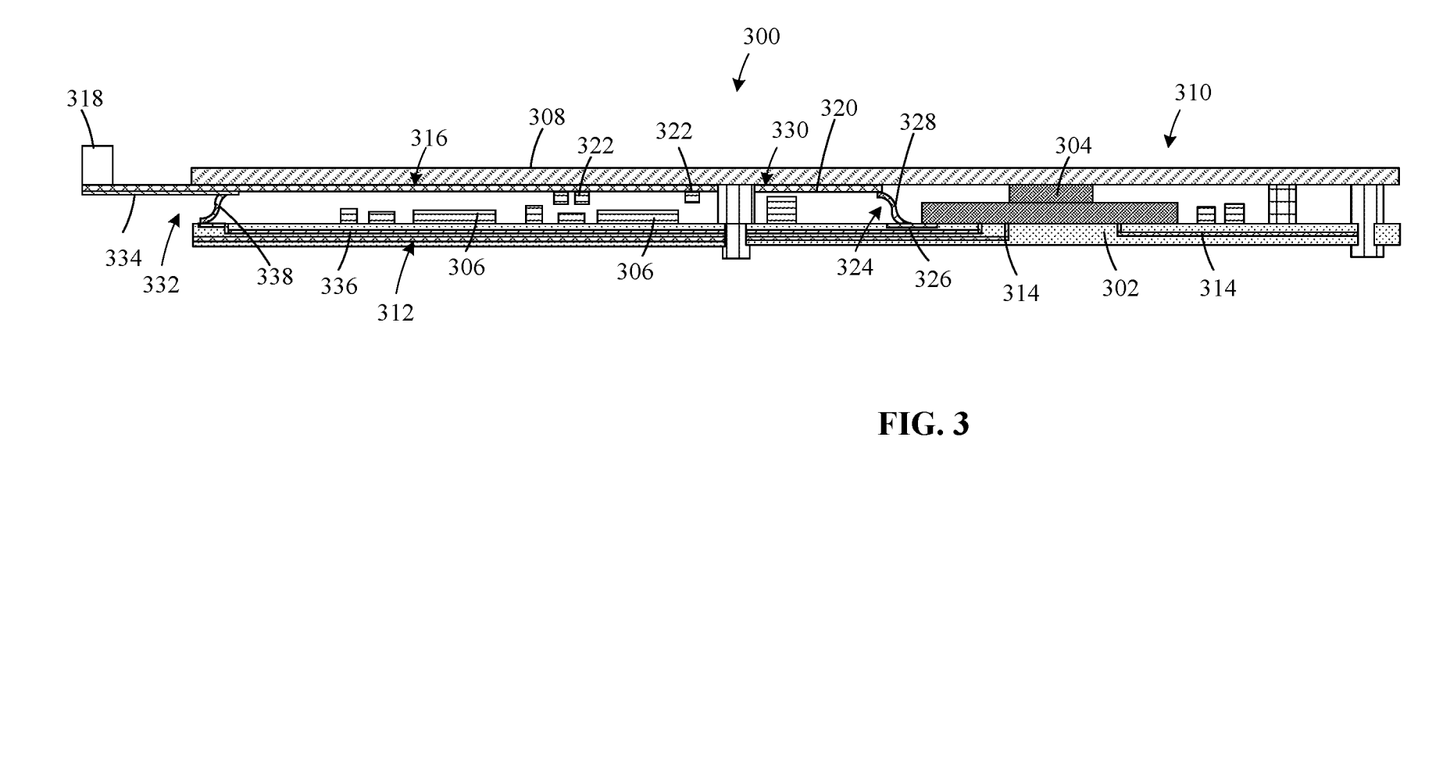
FIG. 3 is a cross-sectional view of another example thermal management system disclosed herein.

FIG. 3 is cross-sectional view of another example hardware component assembly 300 disclosed herein. The example hardware component assembly 300 disclosed herein that can implement the electronic device 100 of FIG. 1, a tablet, a mobile device, and/or any other electronic device that employs passive cooling.

Referring to FIG. 3, the hardware component assembly 300 of the illustrated example includes a printed circuit board 302 (PCB)) and a processor 304 (e.g., a system on chip (SOS)). The circuit board 302 supports one or more circuit components 306 (e.g., resistors, transistors, capacitors, diodes, inductors, integrated circuits, etc.). The hardware component assembly 300 of the illustrated example includes a thermally conductive structure 308 of a thermal management system 310 that is structured to dissipate heat generated by the processor 304 and/or the circuit components 306. The processor 304 of the illustrated example is positioned between the circuit board 302 and the thermally conductive structure 308.

To reduce a number of signal routings formed on the circuit board 302, the example hardware component assembly 300 of the illustrated example separates at least portions of signal routings between the circuit board 302 and the thermally conductive structure 308. The circuit board 302 of the illustrated example includes a plurality of first signal paths 312 defined by a plurality of traces 314. The first signal paths 312 can process high speed signals and/or critical signals of an electronic device. In some examples, the first signal paths 312 and/or the traces 314 communicatively and/or electrically couple the processor 304 and one or more electronic components (e.g., the electronic components 108 of FIG. 1).

The thermally conductive structure 308 of the illustrated example carries a second signal path 316 to communicatively and/or electrically couple the processor 304 and an electronic component 318 (e.g., one or more of the electronic components 108 of FIG. 1, etc.) of an electronic device. The second signal path 316 of the illustrated example is a second trace 320 and circuit components 322 (e.g., transistors, capacitors, resistors, inductors, diodes, integrated circuits, etc.) that are communicatively and/or electrically coupled via the second trace 320. To communicatively couple the second signal path 316 and the processor 304, the circuit board 302 of the illustrated example includes a first connection signal path 324 (e.g., similar to the connection signal path 250 of FIG. 2). For example, the first connection signal path 324 includes a first connection trace 326 formed on the circuit board 302 and a first trace connector 328 to electrically and/or communicatively couple the second trace 320 and the first connection trace 326. For example, the first trace connector 328 of the illustrated example is a spring connector (e.g., a flex-to-circuit board connector).

In the illustrated example, the second signal path 316 defined by the second trace 320 provides a departing signal routing 330. For example, the departing signal routing 330 enables commands, signals and/or instructions from the processor 304 to the electronic component 318.

To return signals from the electronic component 318 to the processor 304, the circuit board 302 of the illustrated example employs a return signal path 332. The return signal path 332 of the illustrated example is defined by a first return trace 334 and a second return trace 336. The first return trace 334 couples to the electronic component 318 at a first end and a second end opposite the first end is supported by the thermally conductive structure 308. The second return trace 336 is formed with the circuit board 302 and includes a first end that is electrically coupled to the first return trace 334 and a second end that is electrically coupled to the processor 304. To electrically couple the first return trace 334 and the second return trace 336, the hardware component assembly 300 of the illustrated example includes a second trace connector 338. For example, a first end of the second trace connector 338 is coupled to the first return trace 334 and a second end of the second trace connector 338 opposite the first end is coupled to the second return trace 336. For example, the second trace connector 338 of the illustrated example is a spring connector (e.g., a flex-to-circuit board connector). In some examples, the first return trace 334 can be connected to the second return trace 336 by soldering a wire or other connector between the first return trace 334 and the second return trace 336. The thermally conductive structure 308 of the illustrated example functions similar to the thermally conductive structure 208 of FIG. 2.

Figure 4:
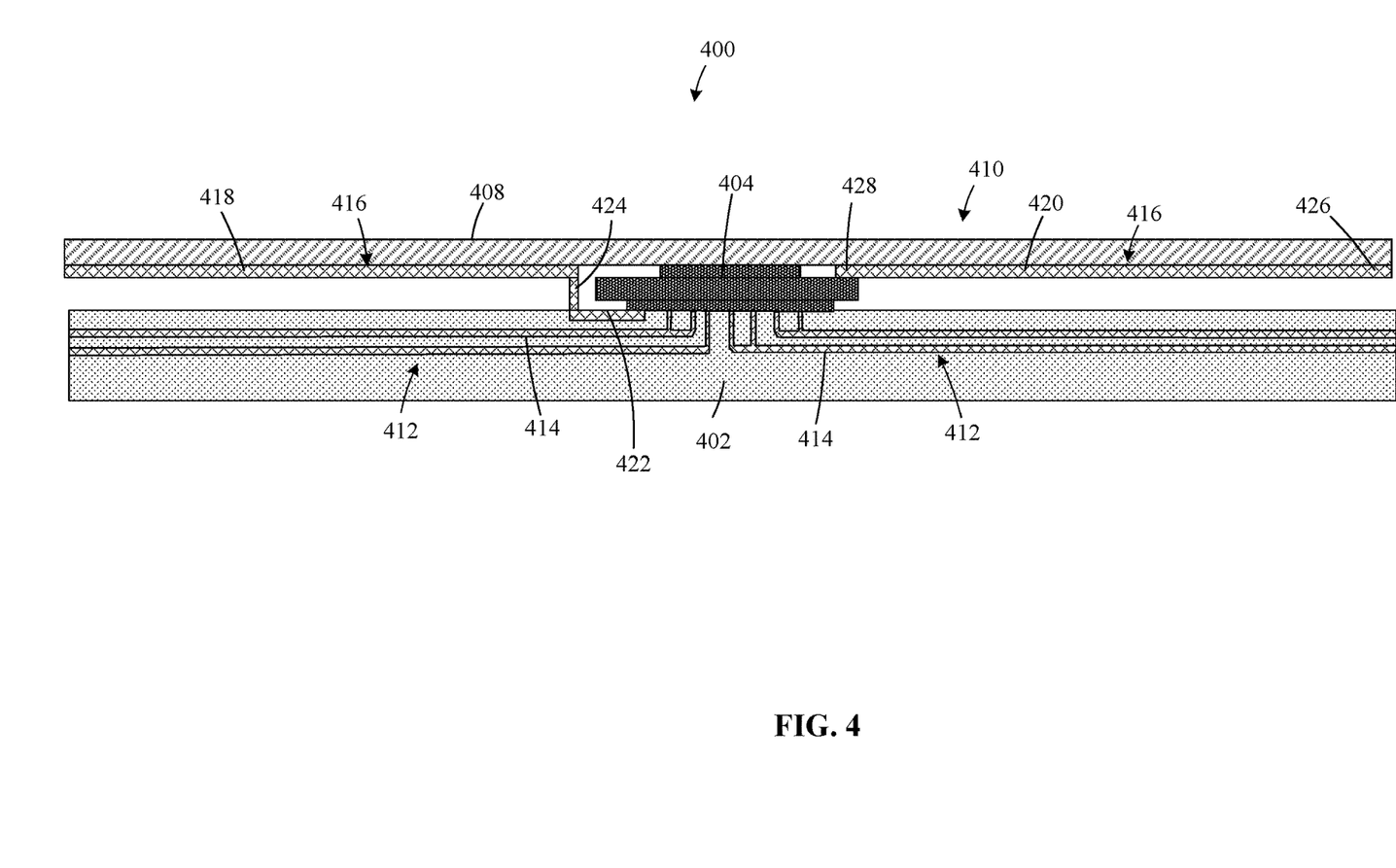
FIG. 4 is a cross-sectional view of another example thermal management system disclosed herein.

FIG. 4 is cross-sectional view of another example hardware component assembly 400 disclosed herein. The example hardware component assembly 400 disclosed herein can implement the electronic device 100 of FIG. 1, a tablet, a mobile device, and/or any other electronic device that employs passive cooling.

Referring to FIG. 4, the hardware component assembly 400 of the illustrated example includes a printed circuit board 402 (PCB)) and a processor 404 (e.g., a system on chip (SOS)). The hardware component assembly 400 of the illustrated example includes a thermally conductive structure 408 of a thermal management system 410 that is structured to dissipate heat generated by the processor 404 and/or other components of an electronic device. The processor 406 of the illustrated example is positioned between the circuit board 402 and the thermally conductive structure 408.

To reduce a number of signal routings formed on the circuit board 402, the example hardware component assembly 400 of the illustrated example separates at least portions of signal routings between the circuit board 402 and the thermally conductive structure 408. The circuit board 402 and/or the thermally conductive structure 408 supports one or more circuit components (e.g., resistors, transistors, capacitors, diodes, inductors, integrated circuits, etc.).

The circuit board 402 of the illustrated example includes a plurality of first signal paths 412 defined by a plurality of traces 414. The first signal paths 412 can process high speed signals and/or critical signals of an electronic device. In some examples, the first signal paths 412 and/or the traces 414 communicatively and/or electrically couple the processor 404 and one or more electronic components (e.g., the electronic components 108 of FIG. 1).

The thermally conductive structure 408 of the illustrated example carries a plurality of second signal paths 416 to communicatively and/or electrically couple the processor 404 and a plurality of electronic components (e.g., one or more of the electronic components 108 of FIG. 1, etc.) of an electronic device. The second signal paths 416 of the illustrated example includes a first trace 418 and a second trace 420. To communicatively couple the first trace 418 and the processor 404, the circuit board 402 of the illustrated example includes a connection trace 422 and a trace connector 424 to electrically and/or communicatively couple the first trace 418 and the processor 404. For example, the trace connector 424 of the illustrated example can be a via, a conductive structure such as a copper rivet, a flex-to-circuit board connector, a wire, and/or any other connector.

In the illustrated example, the second trace 420 is directly coupled to the processor 404. For example, a first end 426 of the second trace 420 can be electrically and/or communicatively coupled to an electronic component and a second end 428 opposite the first end is electrically and/or communicatively coupled to the processor 404. For example, the second end of the second trace 420 is directly attached to the processor 404 (e.g., via soldering, a flex-to-board connector, and/or any other connector(s)). In this manner, the second trace 420 does not require a connection to the circuit board 402. In other words, the second trace 420 does not require a trace connector between the circuit board 402 and the second trace 420 to communicatively and/or electrically couple the second trace 420 and the processor 404. The thermally conductive structure 408 of the illustrated example functions similar to the thermally conductive structure 208 of FIG. 2 and its function is not repeated.

Figure 5:
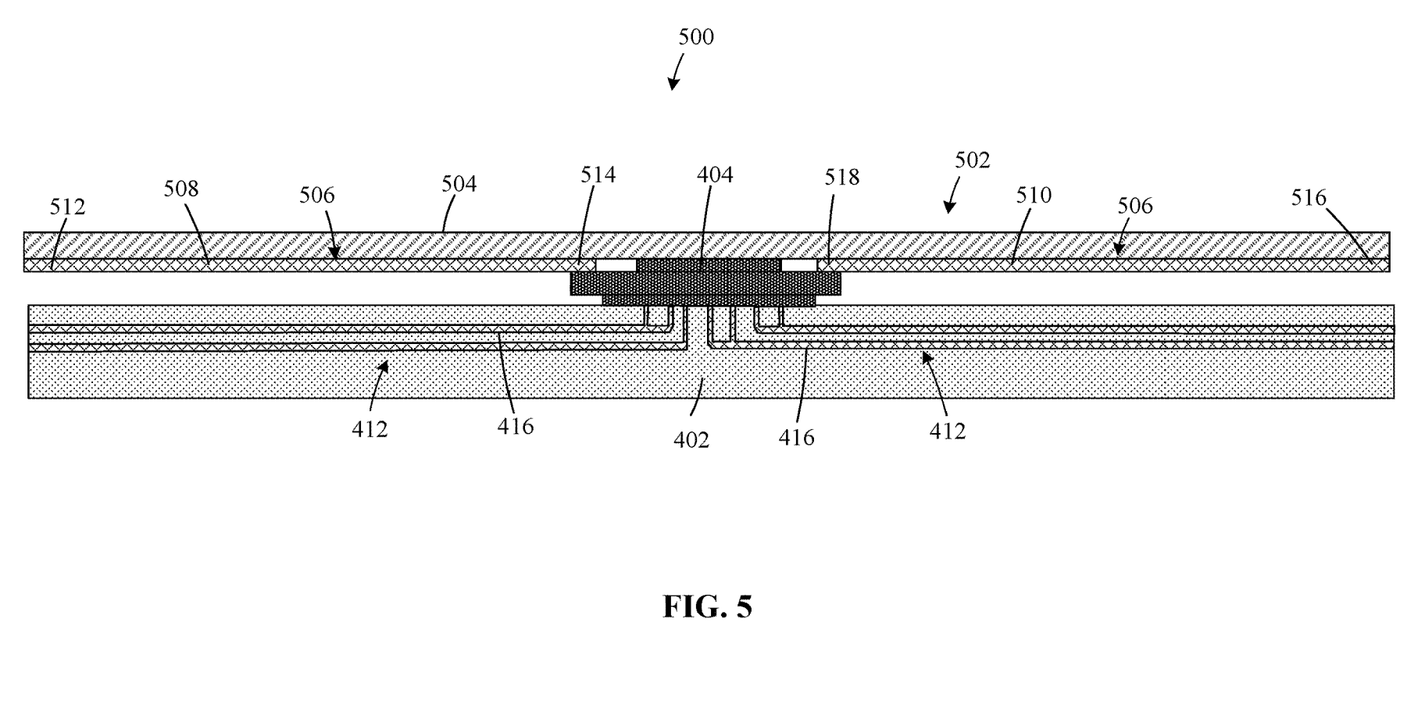
FIG. 5 is a cross-sectional view of yet another example thermal management system.

FIG. 5 is a cross-sectional view of another example hardware component assembly 500 disclosed herein. The example hardware component assembly 500 disclosed herein can implement the electronic device 100 of FIG. 1, a tablet, a mobile device, and/or any other electronic device that employs passive cooling. Many of the components of the example hardware component assembly 500 of FIG. 5 that are substantially similar or identical to the components described above in connection with FIG. 4. As such, those components will not be described in detail again below. Similar or identical reference numbers will be used for like structures in FIG. 5 as used in FIG.4. For example, the hardware component assembly 500 includes a circuit board 402, a processor 404 (e.g., a central processing unit), a plurality of first signal paths 412, and traces 414 that are constructed substantially similar to the hardware component assembly 400 of FIG. 4.

The hardware component assembly 500 of the illustrated example includes a thermal management system 502 having a thermally conductive structure 504. The thermally conductive structure 504 of the illustrated example that carries a plurality of second signal paths 506 to communicatively and/or electrically couple the processor 404 and a plurality of electronic components (e.g., one or more of the electronic components 108 of FIG. 1, etc.) of an electronic device. The second signal paths 506 of the illustrated example includes a first trace 508 and a second trace 510. To communicatively couple the first trace 508 and the processor 404, the first trace 508 is directly coupled (e.g., attached) to the processor 404. Likewise, to communicatively couple the second trace 510 and the processor 404, the second trace 510 is directly coupled (e.g., attached) to the processor 404. For example, a first end 512 of the first trace 508 can be electrically and/or communicatively coupled to an electronic component and a second end 514 opposite the first end 512 is electrically and/or communicatively coupled to the processor 404. Similarly, for example, a first end 516 of the second trace 510 can be electrically and/or communicatively coupled to an electronic component and a second end 518 opposite the first end 516 is electrically and/or communicatively coupled to the processor 404.

For example, the second end 514 of the first trace 508 and/or the second end 518 of the second trace 510 is directly attached to the processor 404 (e.g., via soldering, a flex-to-board connector, and/or any other connector(s)). In this manner, the second signal paths 506 (e.g., the first trace 508, the second trace 510, a third trace, etc.) are directly coupled to the processor 404 independently of the circuit board 402. Thus, the second signal paths 506 (e.g., the first trace 508, the second trace 510, a third trace, etc.) do not require a connection to the circuit board 402. In other words, the second signal paths 506 (e.g., the first trace 508, the second trace 510, a third trace, etc.) do not require trace connectors between the circuit board 302 and the second signal paths 506 to communicatively and/or electrically couple the second signal paths 506 (e.g., the first trace 508, the second trace 510, a third trace, etc.) and the processor 404. The thermally conductive structure 504 of the illustrated example functions similar to the thermally conductive structure 208 of FIG. 2.

Figure 6:
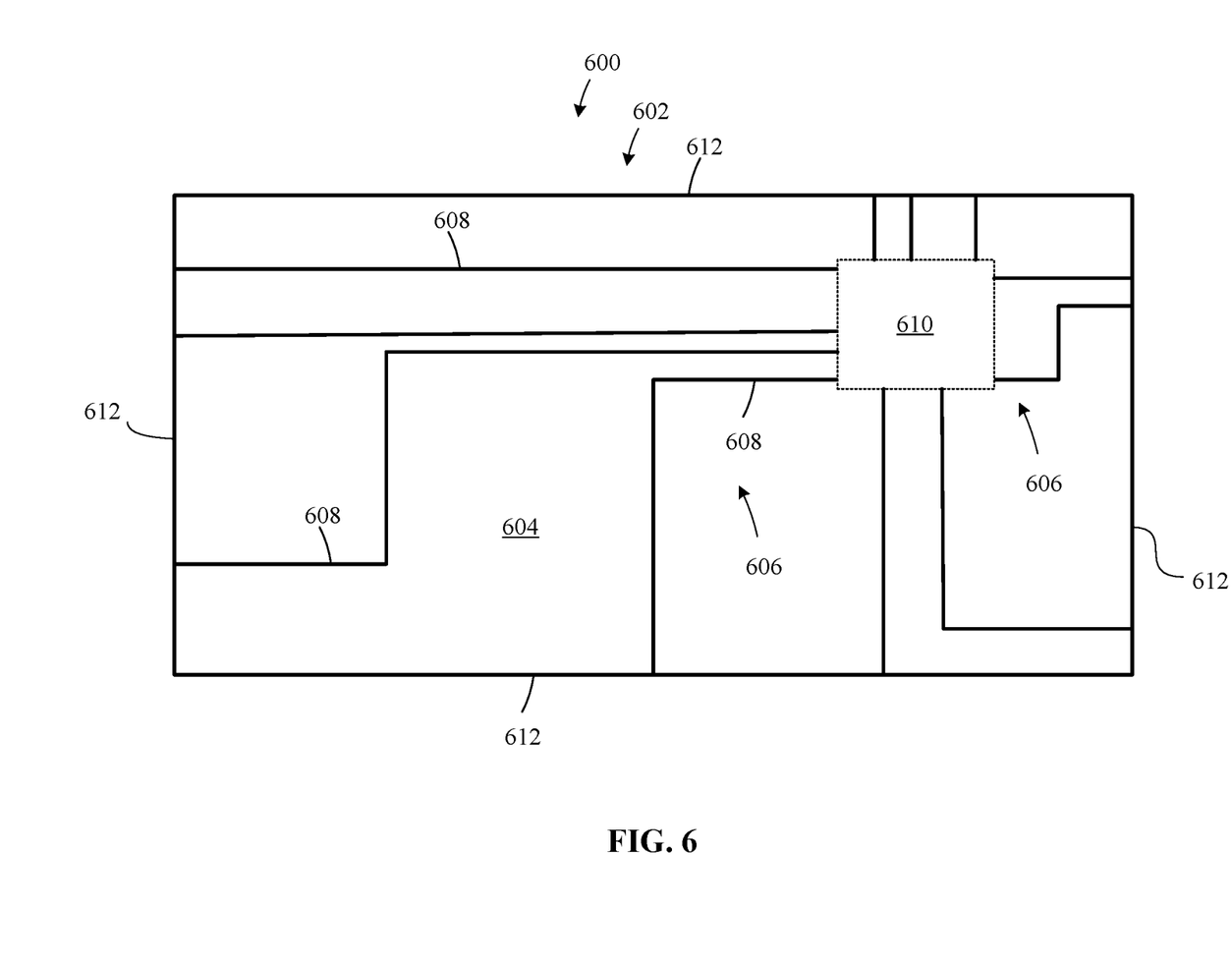
FIG. 6 is a plan view of an example thermally conductive structure that can implement the thermal management systems disclosed herein.

FIG. 6 is a front view of an example thermally conductive structure 600 disclosed herein. The thermally conductive structure 600 of the illustrated example can implement the example thermally conductive structures 208, 308, 408 and 504 disclosed herein. The thermally conductive structure 600 of the illustrated example is a vapor chamber 602. The thermally conductive structure 600 of the illustrated example has a first surface 604 (e.g., similar to the first surface 216 of FIG. 2) that orients toward a processor (e.g., the processor 204, 304 and 404) when coupled to an electronic device. The first surface 604 of the thermally conductive structure 600 includes a plurality of signal paths 606. For example, the signal paths 606 can implement the second signal paths 232, 316, 416 and/or 506 disclosed herein. The signal paths 606 of the illustrated example include a plurality of traces 608 carried by the thermally conductive structure 600. Specifically, the traces 608 are provided across a surface area of the first surface 604 and extend between an area 610 representative of a processor and peripheral edges 612 of the first surface 604. In the illustrated example, the traces 608 are formed on a flexible circuit board and the flexible circuit board is attached to the first surface 604 via adhesive. In some examples, the thermally conductive structure 600 and/or the traces 608 are formed via additive manufacturing (e.g., 3D printing). In other examples, the thermally conductive structure can be heat pipe, a cold plate heat sink, a heat spreader, and/or any other heat sink and/or component of a thermal management system that provides sufficient surface area for placement of one more signal paths or traces (e.g., flexible circuits, etc.).

Figure 7:
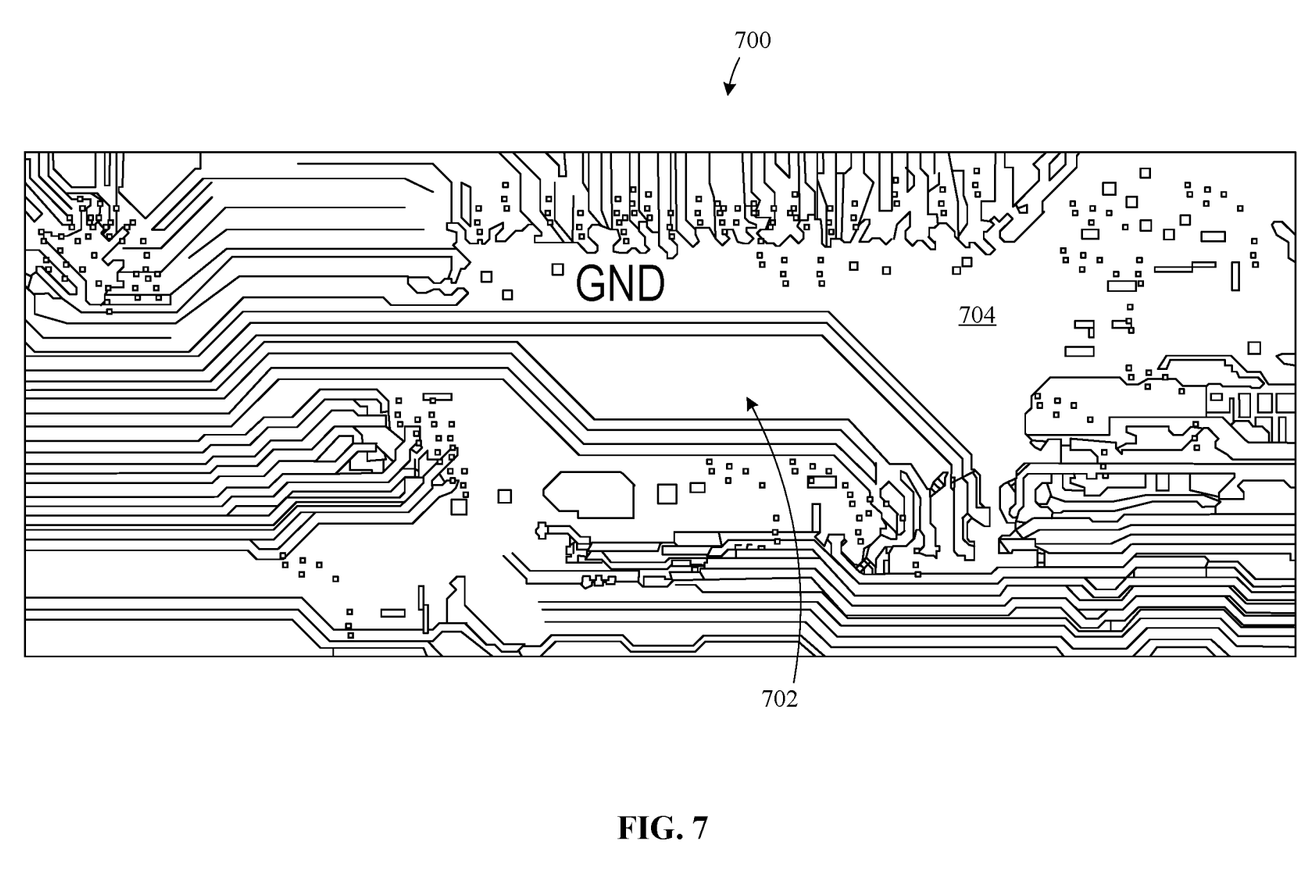
FIG. 7 is a plan view of an example circuit board configured for use with an example thermal management system disclosed herein.

FIG. 7 is a plan view of an example circuit board 700 that is configured for use with an example thermally conductive structures disclosed herein (e.g., the thermally conductive structure 208, 308, 408 and 506). The example circuit board 700 can implement the example circuit boards 202, 302 and 402 disclosed herein. For example, signal routing of the circuit board 700 has been separated via a thermally conductive structure disclosed herein. For example, the circuit board 700 of the illustrated example includes a plurality of first signal paths 702 (e.g., first transfer signal routing). Specifically, the first signal paths 702 are provided for high speed signals and/or critical signals. As shown in FIG. 7, an area 704 of the circuit board 700 does not include second signal paths (e.g., the second signal paths 232, 316, 416 and 506) because the second signal paths are to be supported by a thermally conductive structure of an electronic device. Thus, separating the signal paths between the circuit board 700 and a thermally conductive structure of an electronic device reduces signaling congestion and/or signaling bottlenecks on the circuit board 700.

Figure 8:
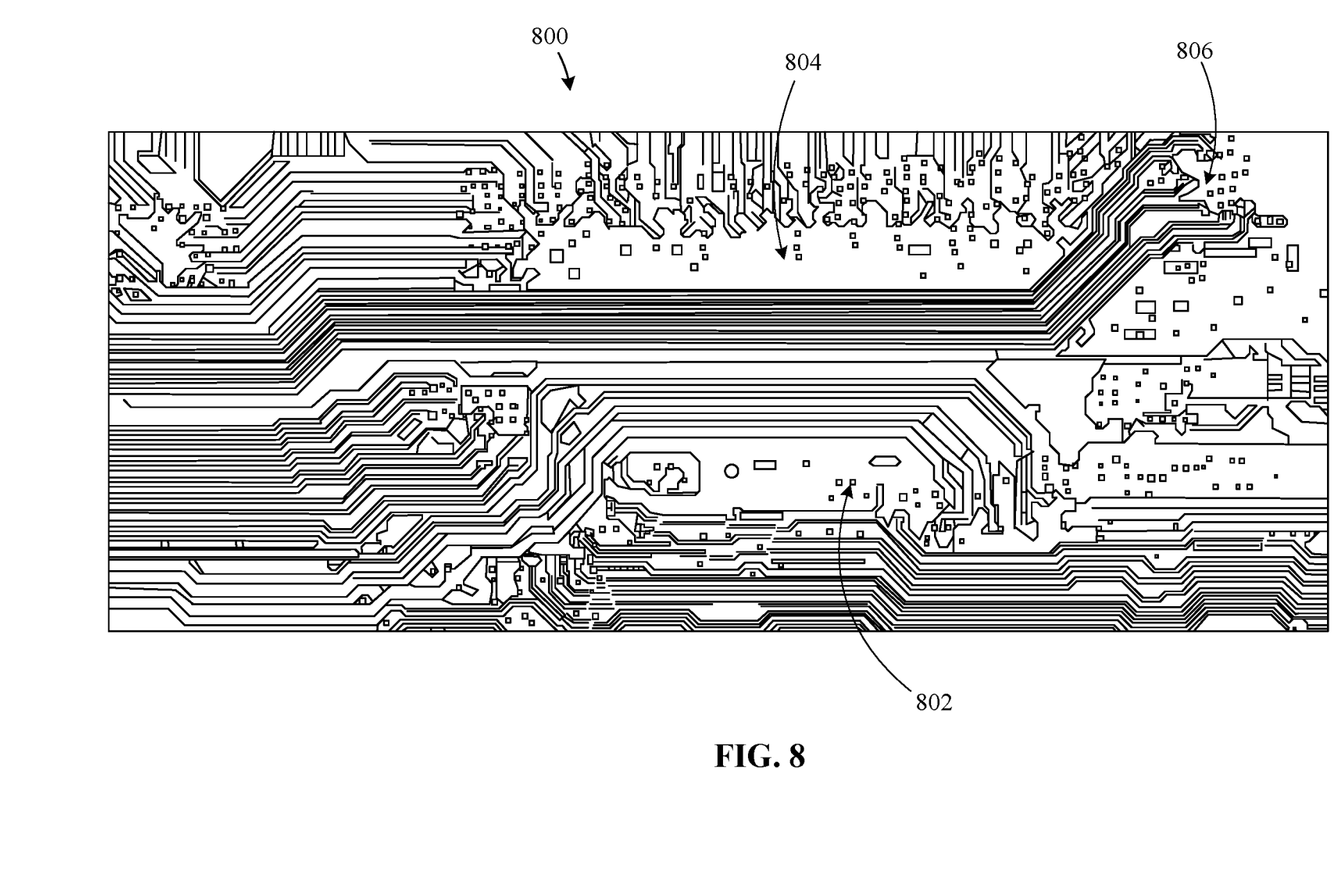
FIG. 8 is a front view of an example circuit board that is not configured for use with an example thermal management system disclosed herein.

FIG. 8 is a plan view of an example circuit board 800 that is not configured for use with an example thermally conductive structure disclosed herein. In other words, the circuit board 800 of FIG. 8 is not configured for separating signal routings. For example, the circuit board 800 includes first signal paths 802 and second signal paths 804. As shown in FIG. 8, an area 806 of the circuit board 800 (e.g., compared to the area 704 of the circuit board 700 of FIG. 7) includes dense signal routing compared to the circuit board 700 of FIG. 7.

The foregoing examples of the hardware component assemblies 200, 300, 400, 500, the circuit boards 202, 302, 402, the thermally conductive structures 208, 308, 408, 504, 600, the first signal paths 230, 312, 412, 702, the second signal paths 232, 316, 416, and/or other components disclosed herein can be employed with an electronic device, a thermal management system, or a thermally conductive structure. Although each example of the hardware component assemblies 200, 300, 400, 500, the circuit boards 202, 302, 402, the thermal management systems 210, 310, 410, 502, the thermally conductive structures 208, 308, 408, 504, 600, the first signal paths 230, 312, 412, 702, the second signal paths 232, 316, 416, and/or other components disclosed above have certain features, it should be understood that it is not necessary for a particular feature of one example to be used exclusively with that example. Instead, any of the features described above and/or depicted in the drawings can be combined with any of the examples, in addition to or in substitution for any of the other features of those examples. Features of one example are not mutually exclusive to the features of another example. Instead, the scope of this disclosure encompasses any combination of any of the features.

Example methods, apparatus, systems, and articles of manufacture to separate and/or route signaling paths of a circuit board are disclosed herein. The examples disclosed herein separate signal routing paths on different levels adjacent a processor by using thermal structures of a thermal management system. The examples disclosed herein increase space on a circuit board that can be used to improve signal integrity, develop thinner circuit boards (e.g., in a z-direction), reduce signal bottlenecks and/or reduce an overall dimensional envelope of an electronic device. The examples disclosed herein enable signal routing to be seperate between a circuit board and a structure of a thermal management system. In this manner, some routings such as, for example, high speed data or other I/O components can be routed via the thermal structure of the thermal management system to allow more space on a circuit board (e.g., a mother board) for critical routing. Specifically, the routings are seprated or transferred near the processor (CPU), which enable smore space for routing at the board. Further examples and combinations thereof include the following:

Example 1 includes an electronic device including a housing to house a first electronic component and a second electronic component. A circuit board is positioned inside the housing. The circuit board including a first signal path to communicatively couple a processor carried by the circuit board and the first electronic component. A thermally conductive structure is positioned adjacent the circuit board. The thermally conductive structure is to dissipate heat generated by the processor. The thermally conductive structure is to carry at least a portion of a second signal path to communicatively couple the processor and the second electronic component.

Example 2 includes the electronic device of example 1, where the second signal path is formed on a surface of the thermally conductive structure.

Example 3 includes the electronic device of example 1, the second signal path is attached to a first surface of the thermally conductive structure.

Example 4 includes the electronic device of example 3, the second signal path is a trace formed on a flexible circuit board.

Example 5 includes the electronic device of example 4, where the flexible circuit board is attached to the first surface of the thermally conductive structure via adhesive.

Example 6 includes the electronic device of example 3, the first surface is oriented toward the circuit board.

Example 7 includes the electronic device of example 1, the second signal path is directly coupled from the thermally conductive structure to the processor.

Example 8 includes the electronic device of example 1, further including a spring connector to couple the second signal path between the thermally conductive structure and the processor.

Example 9 includes the electronic device of example 8, where the second signal path is coupled to the processor via a third trace formed on the circuit board, the third trace coupling the spring connector and the processor.

Example 10 includes the electronic device of example 1, where the second electronic component includes at least one of a camera, a speaker, a microphone or an input/output (I/O) connector.

Example 11 includes the electronic device of example 1, where the thermal conductive structure is a vapor chamber.

Example 12 includes an example electronic device having a processor, a circuit board having a plurality of first traces coupled to the processor, and a heat sink to dissipate heat generated by the processor. The heat sink including one or more second traces to electrically couple to the processor.

Example 13 includes the electronic device of example 12, where the processor is positioned between the circuit board and the heat sink.

Example 14 includes the electronic device of example 12, where the one or more second traces are formed on a flexible circuit.

Example 15 includes the electronic device of example 14, the flexible circuit is attached to a surface of the heat sink.

Example 16 includes the electronic device of example 12, further including a trace connector to couple one or more second traces and the processor via the circuit board.

Example 17 includes the electronic device of example 12, the one or more second traces are directly coupled to the processor.

Example 18 includes an example electronic device having a processor, a circuit board having a plurality of first traces coupled to the processor, and a thermal management system to dissipate heat from components of the electronic device. The thermal management system including a thermally conductive structure. A flexible circuit that defines a plurality of second traces. The flexible circuit is attached to the thermal conductive structure. The plurality of second traces being coupled to the processor.

Example 19 includes the electronic device of example 18, where the plurality of second traces is directly coupled to the processor.

Example 20 includes the electronic device of example 18, where the first traces are to electrically couple the processor and respective ones of first electronic components, and the second traces electrically are to couple the processor and respective ones of second electronic components different than the first electronic components.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An electronic device comprising:
a housing to house a first electronic component and a second electronic component;
a circuit board inside the housing, the circuit board including a first signal path to communicatively couple a processor carried by the circuit board and the first electronic component;
a thermal conductor adjacent the circuit board, the thermal conductor to dissipate heat generated by the processor, the thermal conductor to carry at least a portion of a second signal path to communicatively couple the processor and the second electronic component; and
a spring connector to couple the second signal path between the thermal conductor and the processor.

2. The electronic device as defined in claim 1, wherein the second signal path is on a surface of the thermally conductive structure.

3. The electronic device as defined in claim 1, wherein the second signal path is attached to a first surface of the thermal conductor.

4. The electronic device as defined in claim 3, wherein the second signal path is a trace on a flexible circuit board.

5. An electronic device comprising:
a housing to house a first electronic component and a second electronic component;
a circuit board inside the housing, the circuit board including a first signal path to communicatively couple a processor carried by the circuit board and the first electronic component;
a thermally conductive structure adjacent the circuit board, the thermally conductive structure to dissipate heat generated by the processor, the thermally conductive structure to carry at least a first portion of a second signal path, at least a second portion of the second signal path on a flexible circuit board, the second signal path to communicatively couple the processor and the second electronic component, the flexible circuit board attached to a first surface of the thermally conductive structure via adhesive.

6. The electronic device as defined in claim 3, wherein the first surface is oriented toward the circuit board.

7. The electronic device as defined in claim 1, wherein the second signal path is directly coupled from the thermal conductor to the processor.

8. The electronic device as defined in claim 1, wherein the second signal path is coupled to the processor via a third trace on the circuit board, the third trace coupling the spring connector and the processor.

9. The electronic device as defined in claim 1, wherein the second electronic component includes at least one of a camera, a speaker, a microphone, or an input/output (I/O) connector.

10. The electronic device as defined in claim 1, wherein thermal conductor is a vapor chamber.

11. An electronic device comprising:
a processor;
a first circuit board having a plurality of first traces coupled to the processor; and
a heat sink to dissipate heat generated by the processor, the heat sink including one or more second traces carried by the heat sink to electrically couple to the processor, the one or more second traces between the heat sink and one or more of the plurality of the first traces of the first circuit board, and the processor between the first circuit board and the heat sink.

12. The electronic device as defined in claim 11, wherein the one or more second traces are on a second circuit board.

13. The electronic device as defined in claim 12, wherein the second circuit board is attached to a surface of the heat sink.

14. The electronic device as defined in claim 11, further including a trace connector to couple at least one of the one or more second traces and the processor.

15. The electronic device as defined in claim 11, wherein the one or more second traces are directly coupled to the processor.

16. An electronic device comprising:
a processor;
a printed circuit board having a plurality of first traces coupled to the processor;
a thermal management system to dissipate heat from the electronic device, the thermal management system including a thermally conductive structure, the processor between the circuit board and the thermally conductive structure; and
a flexible circuit board defining a plurality of second traces, the flexible circuit board attached to the thermal conductive structure, the plurality of second traces coupled to the processor, the flexible circuit board oriented toward the printed circuit board such that the flexible circuit board is between the thermally conductive structure and the circuit board.

17. The electronic device as defined in claim 16, wherein the plurality of second traces is directly coupled to the processor.

18. The electronic device as defined in claim 16, wherein the first traces are to electrically connect the processor and respective ones of first electronic components, and the second traces are to electrically connect the processor and respective ones of second electronic components different than the first electronic components.

19. The electronic device as defined in claim 11, wherein the processor is between the first traces and the second traces.

20. The electronic device as defined in claim 16, wherein the flexible circuit board is attached to a first surface of the thermally conductive structure that is oriented toward the printed circuit board.

* * * * *